US011825614B2

(12) United States Patent
Tu et al.

(10) Patent No.: US 11,825,614 B2
(45) Date of Patent: Nov. 21, 2023

(54) HOUSING AND MOBILE TERMINAL

(71) Applicant: HUAWEI TECHNOLOGIES CO., LTD., Guangdong (CN)

(72) Inventors: Yiming Tu, Wuhan (CN); Wangchun Lyu, Dongguan (CN); Heshuai Si, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 383 days.

(21) Appl. No.: 17/171,126

(22) Filed: Feb. 9, 2021

(65) Prior Publication Data

US 2021/0168948 A1 Jun. 3, 2021

Related U.S. Application Data

(63) Continuation of application No. PCT/CN2019/076352, filed on Feb. 27, 2019.

(30) Foreign Application Priority Data

Aug. 10, 2018 (CN) .......................... 201810912090.X

(51) Int. Cl.
*B32B 3/10* (2006.01)
*H05K 5/00* (2006.01)
*H05K 5/02* (2006.01)
*H05K 5/03* (2006.01)
*B32B 3/30* (2006.01)
(Continued)

(52) U.S. Cl.
CPC ............. *H05K 5/0017* (2013.01); *B32B 3/30* (2013.01); *B32B 7/12* (2013.01); *B32B 27/06* (2013.01); *H05K 5/0004* (2013.01); *H05K 5/0217* (2013.01); *H05K 5/0243* (2013.01);
(Continued)

(58) Field of Classification Search
None
See application file for complete search history.

(56) References Cited

U.S. PATENT DOCUMENTS

2011/0143096 A1 6/2011 Huang

FOREIGN PATENT DOCUMENTS

CN 2789019 Y 6/2006
CN 204774337 U 11/2015
(Continued)

OTHER PUBLICATIONS

Machine translation of CN-107835276-A (Year: 2018).*
Machine translation of CN-207304637-U (Year: 2018).*

*Primary Examiner* — Christopher M Polley
(74) *Attorney, Agent, or Firm* — WOMBLE BOND DICKINSON (US) LLP

(57) ABSTRACT

A housing is provided, the housing includes a housing substrate and at least one double-sided composite texture film located on one side of an inner surface of the housing substrate. The double-sided composite texture film includes a first substrate, a first texture layer located on a first surface of the first substrate, and a second texture layer located on a second surface of the first substrate. The first surface of the first substrate is close to the housing substrate, and the second surface is away from the housing substrate. The first texture layer has a first texture pattern that includes a plurality of grooves and a plurality of bosses. The second texture layer has a second texture pattern that includes a plurality of grooves and a plurality of bosses.

18 Claims, 13 Drawing Sheets

(51) Int. Cl.
    *B32B 7/12*         (2006.01)
    *B32B 27/06*      (2006.01)
    *H04M 1/02*      (2006.01)

(52) U.S. Cl.
    CPC .......... *H05K 5/03* (2013.01); *B32B 2307/418* (2013.01); *H04M 1/026* (2013.01)

(56) References Cited

FOREIGN PATENT DOCUMENTS

| | | | | | |
|---|---|---|---|---|---|
| CN | 105120019 | A | | 12/2015 | |
| CN | 105848879 | A | | 8/2016 | |
| CN | 206584059 | U | | 10/2017 | |
| CN | 107454778 | A | | 12/2017 | |
| CN | 107835276 | A | * | 3/2018 | ............ H04M 1/026 |
| CN | 107835276 | A | | 3/2018 | |
| CN | 107902912 | A | | 4/2018 | |
| CN | 107995329 | A | | 5/2018 | |
| CN | 207304637 | U | * | 5/2018 | |
| CN | 207304637 | U | | 5/2018 | |

\* cited by examiner

HOUSING AND MOBILE TERMINAL

CROSS-REFERENCE TO RELATED APPLICATIONS

This application is a continuation of International Application No. PCT/CN2019/076352, filed on Feb. 27, 2019, which claims priority to Chinese Patent Application No. 201810912090.X, filed on Aug. 10, 2018. The disclosures of the aforementioned applications are hereby incorporated by reference in their entireties.

TECHNICAL FIELD

This application relates to the field of communications technologies, and in particular, to the field of user equipment technologies.

BACKGROUND

With continuous development of display technologies, a user has a higher requirement on appearance design of a mobile terminal, for example, a mobile phone. To improve user experience, a texture pattern used for decoration is disposed on a housing of the mobile phone. Currently, a texture pattern with a decorative effect may be formed on a transparent substrate by using a printing technology. However, a texture pattern obtained in the foregoing fabrication method is simple.

SUMMARY

This application provides a housing and a mobile terminal, to resolve, to some extent, a problem that a texture pattern prepared on a housing of the mobile terminal is relatively simple.

To achieve the foregoing objective, the following technical solutions are used in this application.

According to an aspect of this application, a housing is provided. The housing includes a housing substrate and at least one double-sided composite texture film located on one side of an inner surface of the housing substrate. The double-sided composite texture film includes a first substrate, and the first substrate includes a first surface close to the housing substrate and a second surface away from the housing substrate. The double-sided composite texture film further includes a first texture layer located on the first surface of the first substrate and a second texture layer located on the second surface of the first substrate. The first texture layer has a first texture pattern that includes a plurality of grooves and a plurality of bosses. The second texture layer has a second texture pattern that includes a plurality of grooves and a plurality of bosses. After the first texture pattern and the second texture pattern are superimposed, a new texture pattern may be generated. For example, sizes of the grooves and the bosses in the first texture pattern and the second texture pattern may be of a nanometer scale or a micrometer scale. In this case, according to a Moore fringe interference principle, after the first texture pattern and the second texture pattern are superimposed, an interference fringe is easily generated. The interference fringe may be used as a new texture pattern of the housing. The foregoing new texture pattern is more complex than the single-layer first texture pattern or the single-layer second texture pattern, so that difficulty in copying and imitating the texture pattern is increased, and a product homogenization degree is reduced.

In an embodiment, the housing further includes at least one single-sided composite texture film, and the single-sided composite texture film is located on one side of the inner surface of the housing substrate and is disposed with the composite texture film in a stacked manner. The single-sided composite texture film includes a second substrate and a third texture layer located on a surface that is of the second substrate and that is close to or away from the housing substrate. The third texture layer has a third texture pattern that includes a plurality of grooves and a plurality of bosses. In this case, a more complex texture pattern may be obtained after the third texture pattern in the single-sided composite texture film is superimposed on the first texture pattern and the second texture layer in the double-sided composite texture film, so that decorative effects of a housing texture are more diversified.

In an embodiment, the inner surface of the housing substrate has a fourth texture pattern, and the fourth texture pattern includes a plurality of grooves and a plurality of bosses. A more complex texture pattern may be obtained after the fourth texture pattern, and the first texture pattern and the second texture layer in the double-sided composite texture film are superimposed or after the fourth texture pattern, the first texture pattern and the second texture layer in the double-sided composite texture film, and the third texture pattern in the single-sided composite texture film are superimposed, so that decorative effects of a housing texture are more diversified. In addition, the housing further includes a first bonding layer located on the inner surface of the housing substrate, so that the housing substrate and a multi-layer texture composite film of the housing other than the housing substrate can be bonded and fastened together. In addition, a refractive index of the first bonding layer is different from a refractive index of the housing substrate, so that the fourth texture pattern on the housing substrate can be identified by human eyes.

In an embodiment, an outer surface of the housing substrate has a fifth texture pattern, and the fifth texture pattern includes a plurality of grooves and a plurality of bosses. A more complex texture pattern may be obtained after the fifth texture pattern, and the first texture pattern and the second texture layer in the double-sided composite texture film are superimposed, after the fifth texture pattern, the first texture pattern and the second texture layer in the double-sided composite texture film, and the third texture pattern in the single-sided composite texture film are superimposed, or after the fifth texture pattern, the first texture pattern and the second texture layer in the double-sided composite texture film, the third texture pattern in the single-sided composite texture film, and the fourth texture pattern on the inner surface of the housing are superimposed, so that decorative effects of a housing texture are more diversified.

Optionally, the housing further includes a second substrate, and the second substrate is located between the housing substrate and the double-sided composite texture film. The second substrate can improve rigidity and reliability of the housing.

In an embodiment, the housing further includes an ink layer. The double-sided composite texture film is located between the ink layer and the housing substrate. When the housing further includes a single-sided composite texture film, the single-sided composite texture film may also be located between the ink layer and the housing substrate. The ink layer can provide a color for the housing.

In an embodiment, glass substrates can be massively produced. Therefore, the housing substrate is a glass substrate, to reduce product production difficulty. In addition, a material that forms the first substrate or the second substrate includes polyethylene terephthalate, a thermoplastic polyurethane elastomer, or the like. The polyethylene terephthalate or the thermoplastic polyurethane elastomer has a mass production characteristic.

In an embodiment, a front cover has a light transmission area and a light shielding area located around the light transmission area. The first texture pattern and the second texture pattern are disposed in the light shielding area. In this way, the front cover may also have a complex decorative texture, to improve appearance quality of a mobile terminal.

In an embodiment, the housing substrate is a hardened layer. A material that forms the first substrate or the second substrate includes polyethylene terephthalate, a thermoplastic polyurethane elastomer, or the like. The housing further includes a glossy oil buffer layer, an adhesive layer, and an injection molding layer that are sequentially away from the housing substrate. The glossy oil buffer layer is in contact with the ink layer. In addition, in the housing, the first texture layer closest to the hardened layer is in direct contact with the hardened layer. In this case, the housing may be prepared by using an IMTL process.

In an embodiment, the housing substrate is a hardened layer. The first substrate is a composite plate that includes at least a polycarbonate film substrate and a polymethacrylate substrate that are disposed in a stacked manner. In the housing, the first texture layer closest to the hardened layer is in direct contact with the hardened layer. In this case, the housing may be prepared by using a composite plate technology.

In an embodiment, the housing further includes an optical coating, and the optical coating is located on a surface that is of the ink layer and that is close to the housing substrate. The optical coating can make a color of the ink layer brighter.

In an embodiment, the housing further includes a second bonding layer that is in contact with the first texture layer, the second texture layer, or the third texture layer. A refractive index of the second bonding layer is different from a refractive index of a film layer in contact with the second bonding layer. The second bonding layer is configured to: bond and fasten two adjacent double-sided composite texture films; bond and fasten a double-sided composite texture film and a single-sided composite texture film that are adjacent; or bond and fasten a double-sided composite texture film and another film layer. In this case, the refractive index of the second bonding layer is different from the refractive index of the film layer in contact with the second bonding layer, so that it can be ensured that a texture pattern at the first texture layer, the second texture layer, or the third texture layer is recognized by human eyes.

According to another aspect of this application, a housing is provided. The housing includes a housing substrate and at least one single-sided composite texture film located on one side of an inner surface of the housing substrate. The single-sided composite texture film includes a second substrate and a third texture layer located on a surface that is of the second substrate and that is close to or away from the housing substrate. The third texture layer has a third texture pattern that includes a plurality of grooves and a plurality of bosses.

In an embodiment, the inner surface of the housing substrate has a fourth texture pattern, and the fourth texture pattern includes a plurality of grooves and a plurality of bosses; and/or an outer surface of the housing substrate has a fifth texture pattern, and the fifth texture pattern includes a plurality of grooves and a plurality of bosses. In this case, a new relatively complex texture pattern, for example, an interference texture pattern, is formed by superimposing texture patterns on the inner surface and/or the outer surface of the housing substrate and a texture pattern at the third texture layer of the at least one single-sided composite texture film, to increase diversity and complexity of a decorative effect of the housing, and to increase decoration duplication difficulty of the housing.

In an embodiment, when the inner surface of the housing substrate has the fourth texture pattern, the housing further includes a first bonding layer located on the inner surface of the housing substrate, and a refractive index of the first bonding layer is different from a refractive index of the housing substrate. A technical effect of the first bonding layer is described above. Details are not described herein again.

In an embodiment, the housing includes at least two single-sided composite texture films. The housing further includes a second bonding layer located between two adjacent single-sided composite texture films. A refractive index of the second bonding layer is different from a refractive index of the third texture layer in contact with the second bonding layer. At least two single-sided composite texture films are disposed, so that a placement angle of third texture patterns at third texture layers of different single-sided composite texture films may be adjusted, to form a relatively complex texture pattern after the two single-sided composite texture films are superimposed.

In an embodiment, the housing substrate is a hardened layer. The housing further includes an injection-molding texture layer, and the injection-molding texture layer is disposed with the single-sided composite texture film in a stacked manner and is in contact with the hardened layer. A surface that is of the injection-molding texture layer and that is in contact with the hardened layer has a sixth texture pattern, and the sixth texture pattern includes a plurality of grooves and a plurality of bosses. After the sixth texture pattern at the injection-molding texture layer and the third texture pattern at the third texture layer of the single-sided composite texture film are superimposed, a relatively complex texture pattern may be formed.

In an embodiment, the housing further includes an ink layer, and the single-sided composite texture film is located between the housing substrate and the ink layer.

Optionally, the housing further includes an optical coating, and the optical coating is located on a surface that is of the ink layer and that is close to the housing substrate. In addition, a surface that is of the optical coating and that is away from the ink layer may be in contact with a single-sided composite texture film that is farthest away from the housing substrate. Technical effects of the optical coating and the ink layer are described above. Details are not described herein again.

In an embodiment, the housing substrate is a glass substrate. A technical effect of the glass substrate is described above. Details are not described herein again.

According to another aspect of this application, a housing is provided. The housing includes a housing substrate. An inner surface of the housing substrate has a fourth texture pattern, and the fourth texture pattern includes a plurality of grooves and a plurality of bosses. An outer surface of the housing substrate has a fifth texture pattern, and the fifth texture pattern includes a plurality of grooves and a plurality of bosses. The housing further includes an ink layer located on one side of the inner surface of the housing substrate. A new relatively complex texture pattern is formed by superimposing texture patterns of the inner surface and the outer surface of the housing substrate, to increase diversity and complexity of a decorative effect of the housing.

In an embodiment, the housing further includes an optical coating, a surface on one side of the optical coating is in contact with the inner surface of the housing substrate, and a surface on the other side of the optical coating is in contact with the ink layer.

In an embodiment, the housing substrate is a glass substrate. A technical effect of the glass substrate is described above. Details are not described herein again.

According to another aspect of this application, a mobile terminal is provided, and includes a display and a middle frame. The display is installed in the middle frame. In addition, the mobile terminal further includes any one of the foregoing housings. The housing is a front cover, and the front cover is disposed on an out-light surface of the display. The front cover has a light transmission area and a light shielding area located around the light transmission area. The light transmission area of the front cover can transmit display light emitted by the display, and the light shielding area of the front cover can shield an area that is of the display and in which a drive circuit is disposed. Alternatively, the housing is a back cover, and the back cover is disposed on one side that is of the middle frame and that is away from the out-light surface of the display, to protect internal components such as a mainboard and a battery that are installed on the middle frame. The mobile terminal has a technical effect the same as that of the housing provided in the foregoing embodiments. Details are not described herein again.

REFERENCE SIGNS

01—Housing; 100—Front cover; 11—Middle frame; 120—Back cover; 13—Display; 14—Multi-layer texture composite film; 15—Groove; 16—Boss; 17—Main board; 18—Battery; 20—UV adhesive; 21—Mold; 22—Protective film; 23—Release film; 31—First bonding layer; 32—Second bonding layer; 33—Third bonding layer; 100—Housing substrate; 101—Light transmission area of a front cover; 102—Light shielding area of a front cover; 200—Double-sided composite texture film; 201—First substrate; 202—First texture layer; 212—Second texture layer; 300—Optical coating; 301—Ink layer; 302—Glossy oil buffer layer; 303—Adhesive layer; 304—Injection molding layer; 400—Single-sided composite texture film; 401—Second substrate; 402—Third texture layer; and 500—Injection-molding texture layer.

DESCRIPTION OF EMBODIMENTS

The following describes the technical solutions in the embodiments of this application with reference to the accompanying drawings in the embodiments of this application. Definitely, the described embodiments are merely some rather than all of the embodiments of this application.

The following terms "first" and "second" are merely intended for description, and shall not be understood as an indication or implication of relative importance or implicit indication of a quantity of indicated technical features. Therefore, a feature limited by "first" or "second" may explicitly or implicitly include one or more features.

In addition, in this application, orientation terms such as "upper", "lower", "left", and "right" are defined relative to orientations of the components in the accompanying drawings. It should be understood that these orientation terms are relative concepts, they are used for relative description and clarification, and may change correspondingly according to a change in a position in which a component is placed in the accompanying drawings.

Some embodiments of this application provide a housing. The housing may be applied to a mobile terminal, for example, a mobile phone, a tablet, a personal digital assistant (PDA), or a vehicle-mounted computer. A specific form of the mobile terminal is not particularly limited in the embodiments of this application. For ease of description, an example in which the mobile terminal is a mobile phone is used for description.

Figure 1:
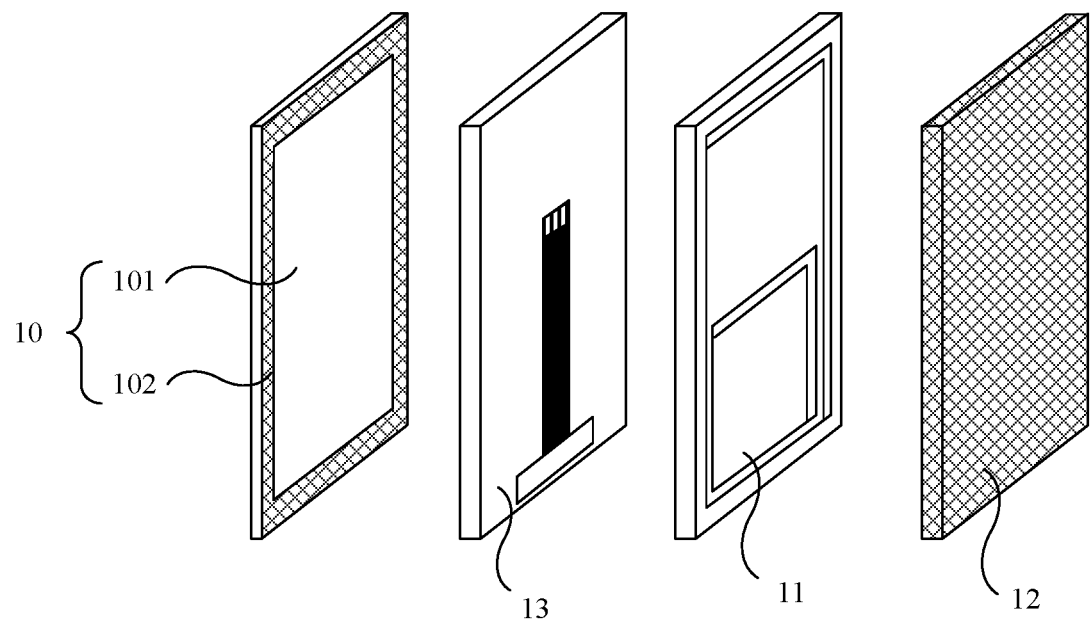
FIG. 1 is a schematic structural diagram of a mobile terminal according to some embodiments of this application.

An architecture of the mobile phone is shown in FIG. 1, and includes a front cover 10, a middle frame 11, and a back cover 12. For a touch mobile phone, the front cover 10 may be a touch glass cover provided with a touch electrode. The front cover 10 has a light transmission area 101 and a light shielding area 102 located around the light transmission area 101. The touch electrode is located in the light transmission area 101. In addition, the mobile phone further includes a display 13 disposed on one side that is of the front cover 10 and that is close to the middle frame 11. A surface that is of the display 13 and that is away from the front cover 10 is bonded to the middle frame 11. Internal components such as a battery, a mainboard, a camera, and an antenna may be disposed on a surface that is of the middle frame 11 and that is away from the display 13. The back cover 12 is installed on the middle frame 11, and the back cover 12 can protect the foregoing internal components.

The housing provided in the embodiments of this application may be the front cover 10 or the back cover 12 of the mobile phone. A structure of the housing 01 is described below in detail by using an example.

Example 1

Figure 2:
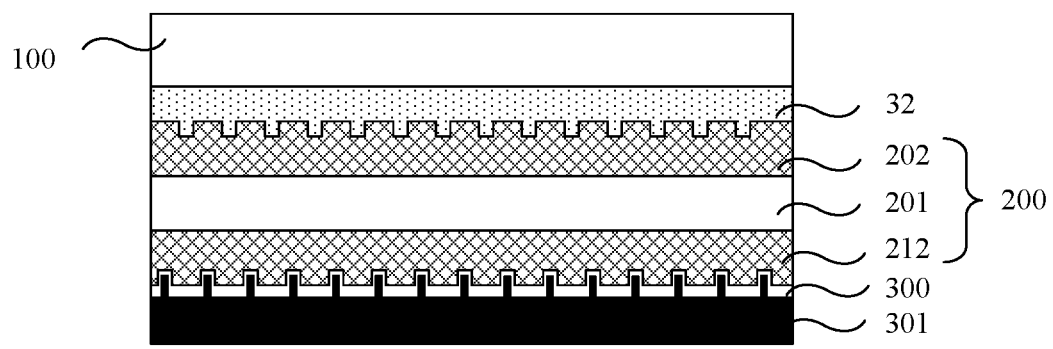
FIG. 2 is a schematic structural diagram 1 of a housing according to some embodiments of this application.

As shown in FIG. 2, the housing 01 includes a housing substrate 100, and the housing substrate 100 has an inner surface and an outer surface. In this application, the outer surface of the housing substrate 100 is a surface that is in direct contact with a finger of a user when the user touches the mobile phone, namely, an outer surface of the housing 01. The inner surface and the outer surface of the housing substrate 100 are disposed opposite to each other.

As shown in FIG. 2, the housing 01 further includes at least one double-sided composite texture film 200 located on one side of the inner surface of the housing substrate 100 (in FIG. 2, description is provided by using an example in which the housing 01 has one double-sided composite texture film 200).

The double-sided composite texture film 200 includes a first substrate 201, a first texture layer 202 located on a first surface of the first substrate 201, and a second texture layer 212 located on a second surface of the first substrate 201.

The first substrate 201 includes the first surface and the second surface that are disposed opposite to each other. The first surface of the first substrate 201 is close to the housing substrate 100, and the second surface is away from the housing substrate 100.

Figure 3:
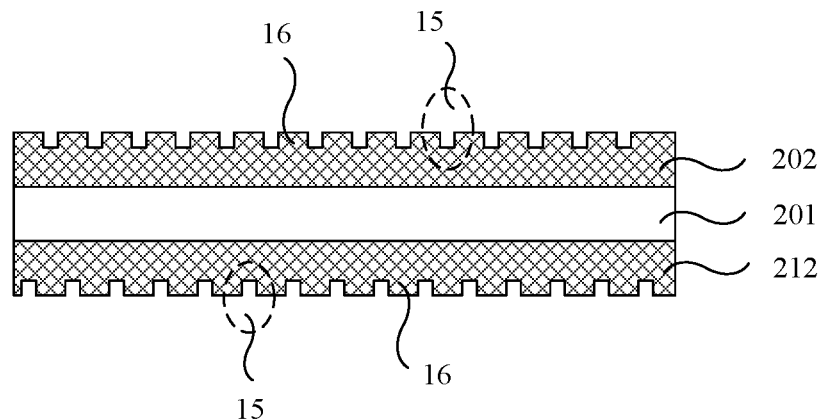
FIG. 3 is a schematic structural diagram of a double-sided composite texture film in FIG. 2.
Figure 4A:
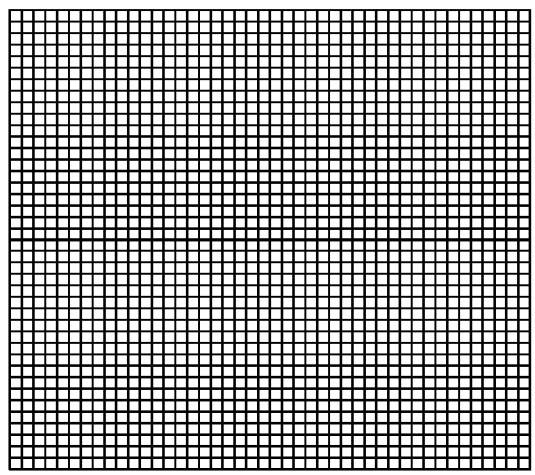
FIG. 4a is a schematic diagram of a first texture pattern according to some embodiments of this application.
Figure 4B:
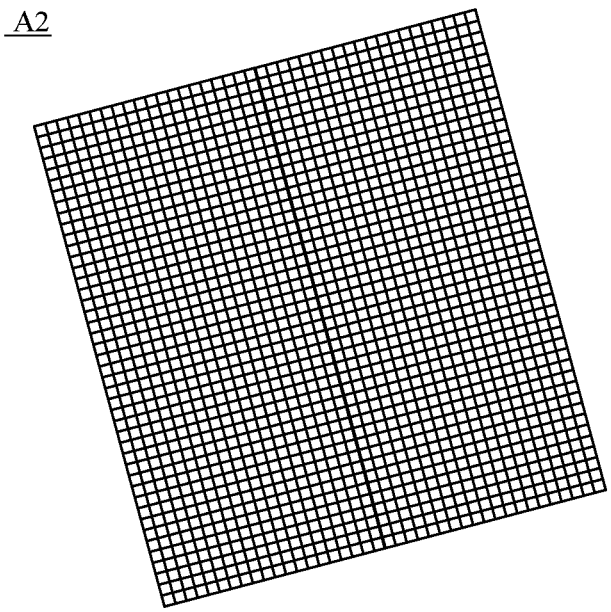
FIG. 4b is a schematic diagram of a second texture pattern according to some embodiments of this application.

In addition, as shown in FIG. 3, the first texture layer 202 has a first texture pattern A1 (as shown in FIG. 4a) that includes a plurality of grooves 15 and a plurality of bosses 16, and the second texture layer 212 has a second texture pattern A2 (as shown in FIG. 4b) that includes a plurality of grooves 15 and a plurality of bosses 16.

It should be noted that in some embodiments of this application, as shown in FIG. 3, the grooves 15 and the plurality of bosses 16 at the first texture layer 202 may be disposed on a surface that is of the first texture layer 202 and that is away from the first substrate 201; or the grooves 15 and the plurality of bosses 16 at the first texture layer 202 may be further disposed on a surface that is of the first texture layer 202 and that is close to the first substrate 201; or the grooves 15 and the plurality of bosses 16 at the first texture layer 202 may be further disposed inside the first texture layer 202. This is not limited in this application.

A manner of disposing the groove 15 and the boss 16 at the second texture layer 212 is the same as that described above. Details are not described herein again. For ease of description, description is provided below by using an example in which the grooves 15 and the plurality of bosses 16 at the first texture layer 202 may be disposed on a surface that is of the first texture layer 202 and that is away from the first substrate 201, and the grooves 15 and the plurality of bosses 16 at the second texture layer 212 may be disposed on a surface that is of the second texture layer 212 and that is away from the first substrate 201.

Figure 4C:
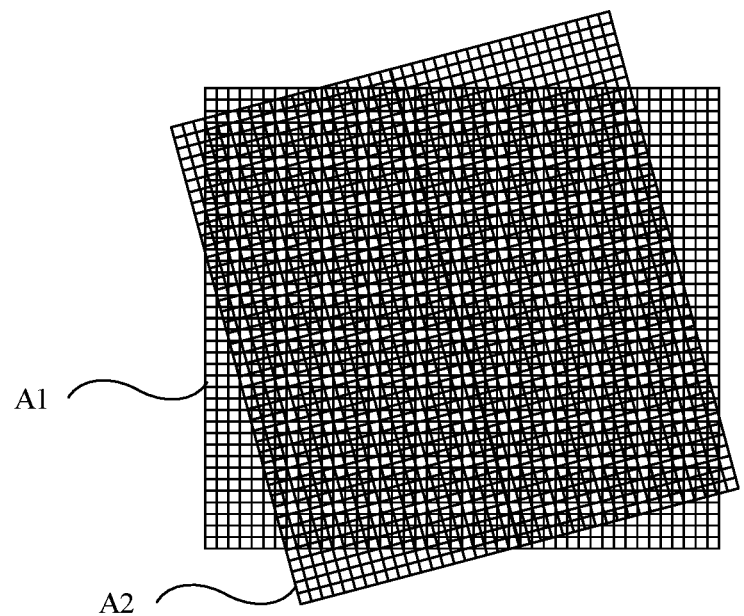
FIG. 4c is a schematic diagram of a new texture pattern formed after the texture patterns shown in FIG. 4a and FIG. 4b are superimposed.

In addition, the first texture pattern A1 and the second texture pattern A2 may be the same or may be different. That the first texture pattern A1 and the second texture pattern A2 are different means that, sizes, arrangements, disposing angles, and the like of the groove 15 and the boss 16 in the first texture pattern A1 are different from sizes, arrangements, disposing angles, and the like of the groove 15 and the boss 16 in the second texture pattern A2. As shown in FIG. 4c, after the first texture pattern A1 and the second texture pattern A2 are superimposed, a new texture pattern may be generated.

In some embodiments of this application, sizes of the grooves 15 and the bosses 16 in the first texture pattern A1 and the second texture pattern A2 may be of a nanometer scale or a micrometer scale. In this case, according to a Moore fringe interference principle, after the first texture pattern A1 and the second texture pattern A2 are superimposed, an interference fringe is easily generated. The interference fringe may be used as a new texture pattern of the housing 01. The foregoing new texture pattern is more complex than the single-layer first texture pattern A1 or the single-layer second texture pattern A2, so that difficulty in copying and imitating the texture pattern is increased, and a product homogenization degree is reduced. In addition, the first texture pattern A1 or the second texture pattern A2 in this embodiment of this application includes the groove 15 and the boss 16. Therefore, the first texture pattern A1 or the second texture pattern A2 is a solid pattern, increasing a solid decorative effect of an appearance of the housing 01.

A structure of the housing 01 shown in FIG. 2 is used as an example to describe a method for fabricating the housing 01 shown in FIG. 2. The fabrication method includes S101 to S108.

S101: Use polyethylene terephthalate (PET) or a thermoplastic polyurethane (TPU) elastomer to fabricate the first substrate 201.

Figure 5A:
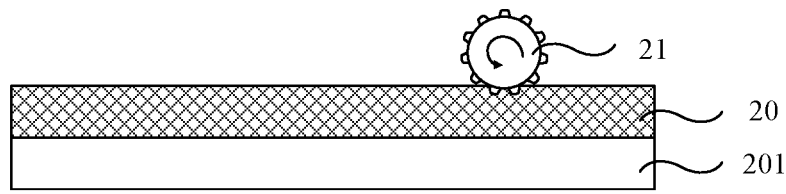
FIG. 5a, FIG. 5b, FIG. 5c, FIG. 5d, and FIG. 5e are schematic diagrams of a process of fabricating a multi-layer texture composite film in FIG. 3 other than a housing substrate.
Figure 5B:
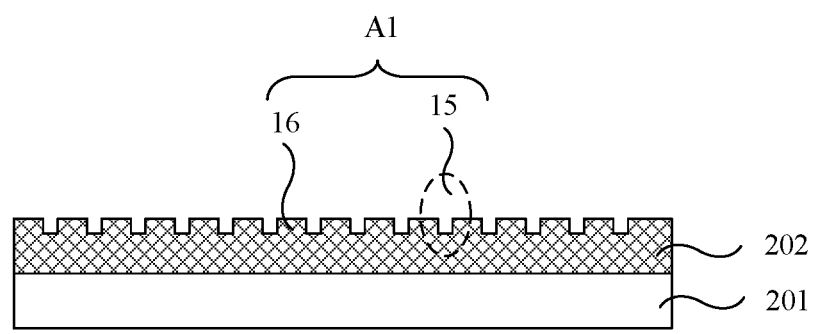

S102: Tile ultraviolet (UV) adhesive 20 on a surface of the first substrate 201, for example, the first surface, then, as shown in FIG. 5a, roll the UV adhesive through a mold 21 having a texture, and expose the UV adhesive, to form the first texture layer 202 that has the first texture pattern A1 shown in FIG. 5b, where when the sizes of the groove 15 and the boss 16 in the first texture pattern A1 are of a nanometer scale (or a micrometer scale), the texture of the mold 21 is a fine texture of a nanometer scale (or a micrometer scale).

Figure 5C:
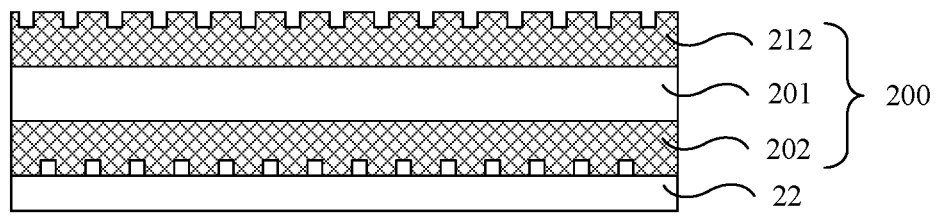

S103: To avoid damage to the first texture pattern A1 in a subsequent fabrication process, a protective film 22 shown in FIG. 5c may cover a surface that is of the first texture layer 202 and that has the first texture pattern A1. Then, a second texture layer 212 having a second texture pattern A2 is formed on the second surface of the first substrate 201 in a same fabrication manner in S102, to complete preparation of one double-sided composite texture film 200.

Figure 5D:
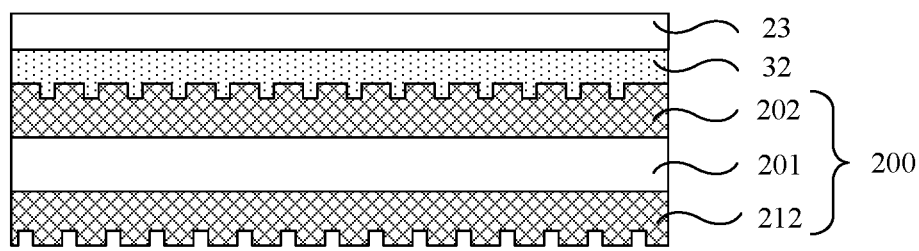

S104: Remove the protective film 22, and coat, with a bonding layer, for example, an optically clear adhesive (OCA), a surface that is of the first texture layer 202 and that has the first texture pattern A1, to form a second bonding layer 32 shown in FIG. 5d and a release film 23 covering the second bonding layer 32.

It should be noted that in this application, a bonding layer that is in direct contact with a surface that is of a texture layer and on which a texture pattern is disposed (for example, the surface that is of the first texture layer 202 and that has the first texture pattern A1) is referred to as the second bonding layer 32.

The second bonding layer 32 is in contact with the first texture layer 202. In this case, some materials of the second bonding layer 32 can be filled in each groove 15 in the first texture pattern A1 at the first texture layer 202. Based on this, a refractive index of the second bonding layer 32 is set to be different from a refractive index of a film layer (for example, the first texture layer 202) in contact with the second bonding layer 32. In this case, even if some materials of the second bonding layer 32 are filled in the groove 15, because the refractive index of the second bonding layer 32 is different from a refractive index of a boss 16 adjacent to the groove 15, brightness of light reflected at a position of the groove 15 is different from brightness of light reflected at a position of the boss 16 that are received by an eye of a user. Therefore, the first texture pattern A1 at the first texture layer 202 can be identified.

Based on this, as shown in FIG. 2, the housing 01 further includes an optical coating 300 and an ink layer 301 that are sequentially away from the housing substrate 100. The double-sided composite texture film 200 is located between the optical coating 300 and the housing substrate 100.

Figure 5E:
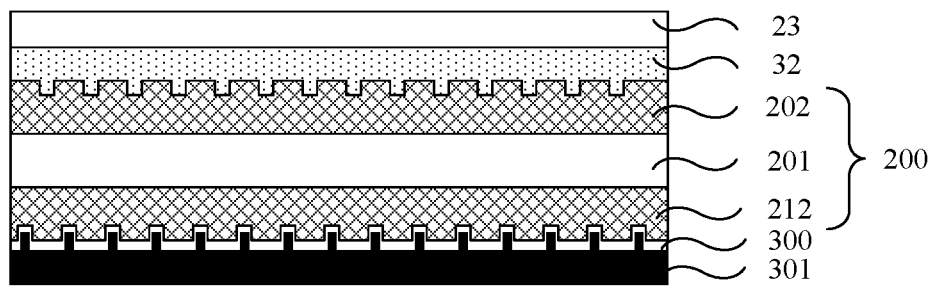

Based on this, the method for fabricating the housing 01 further includes:

S105: Form, by using a vacuum coating process, the optical coating 300 shown in FIG. 5e on one side that is of the double-sided composite texture film 200 and on which the release film 23 is not disposed, namely, the surface that is of the second texture layer 212 and that has the second texture pattern A2. The optical coating 300 may also be referred to as a non-conductive vacuum metallized (NCVM) coating. A material that forms the optical coating 300 may be a coating material such as silicon dioxide ($SiO_2$) or titanium dioxide ($TiO_2$).

S106: Form, by using a printing technology, the ink layer 301 shown in FIG. 5e on a surface that is of the optical coating 300 and that is away from the housing substrate 100.

The ink layer 301 can provide a color for the housing 01, and the optical coating 300 can make the color of the ink layer 301 brighter.

It should be noted that, in the foregoing example, description is provided by using an example in which the housing 01 has the optical coating 300. In some other embodiments of this application, the optical coating 300 may not be disposed in the housing 01. For example, in S105, the printing technology is used to directly form the ink layer 301 that is in direct contact with the double-sided composite texture film 200 on one side that is of the double-sided composite texture film 200 and on which the release film 23 is not disposed, namely, the surface that is of the second texture layer 212 and that has the second texture pattern A2. For ease of description, in most of the following embodiments, a structure in which the optical coating 300 is disposed in the housing 01 is used as an example for description.

S107: Clean the film, and then cut the cleaned film by using a laser cutting technology or a computerized numerical control (CNC) cut-off knife according to a designed size, for example, a size of a back cover 12 of the mobile phone.

S108: Remove the release film 23, and bond the second bonding layer 32 to the housing substrate 100, to form the housing structure shown in FIG. 2.

It should be noted that when the housing substrate 100 is a glass substrate, before S108 is performed, to be specific, before a film obtained through cutting in S107 is bonded to the glass substrate, a chemical strengthening process needs to be performed on the glass substrate, to increase rigidity of the glass substrate. When the housing substrate 100 provided in the following embodiments is a glass substrate, the chemical strengthening process may be performed on the glass substrate. Details are not described in this application.

Figure 6:
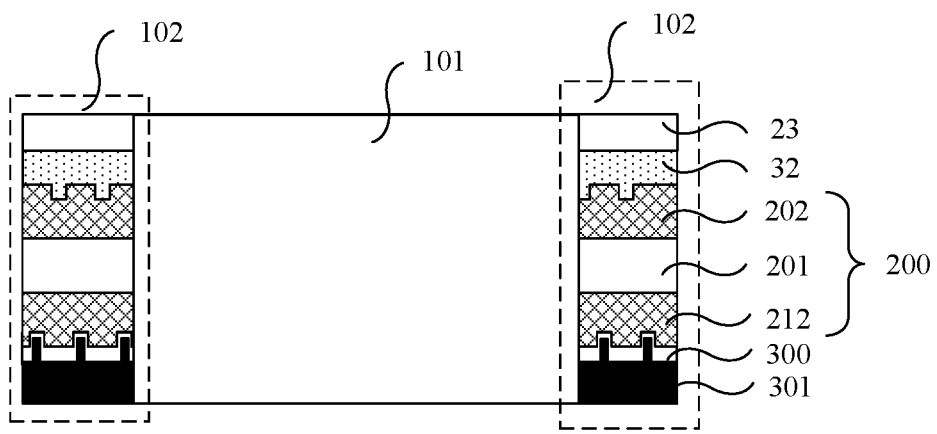
FIG. 6 is a schematic structural diagram of a multi-layer texture composite film according to some embodiments of this application.

In addition, the foregoing description is provided by using an example in which the housing 01 shown in FIG. 2 is the back cover 12 of the mobile phone. When the housing 01 is the front cover 10 of the mobile phone, it can be learned from the foregoing that the front cover 10 has a light transmission area 101 and a light shielding area 102 located around the light transmission area 101. In this case, as shown in FIG. 6, only the foregoing double-sided composite texture film 200, the optical coating 300, and the ink layer 301 need to be formed in the light shielding area 102. For example, in the foregoing S102 to S106, a mask panel is used to shield the light transmission area 101, to avoid forming, in the light transmission area 101, a material corresponding to the foregoing film layer.

Figure 7:
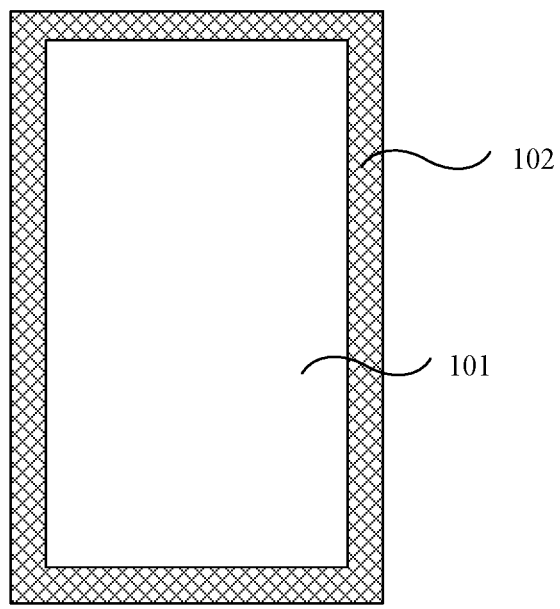
FIG. 7 is a top view of the multi-layer texture composite film shown in FIG. 6.

In this case, a film layer formed after S107 is completed is shown in FIG. 7, and is a closed frame structure. A hollow position of the frame structure corresponds to the light transmission area 101. In this case, the first texture pattern A1 at the first texture layer 202 and the second texture pattern A2 at the second texture layer 212 of the double-sided composite texture film 200 may be disposed in the light shielding area 102, to decorate the light shielding area 102 of the front cover 10 of the mobile phone.

Alternatively, to make the front cover 10, the mask panel may not be used, and instead, a material in the light transmission area 101 of the front cover 10 of the mobile phone may be directly cut in S107, so that the closed frame structure may also be obtained.

Example 2

The foregoing describes the structure and the fabrication method of the housing 01 by using an example in which the housing 01 has one double-sided composite texture film 200. In some other embodiments of this application, the housing 01 may have a plurality of double-sided composite texture films 200 (for example, in FIG. 8, description is provided by using an example in which the housing 01 has two double-sided composite texture films 200). In this case, the plurality of double-sided composite texture films 200 are disposed in a stacked manner.

Figure 8:
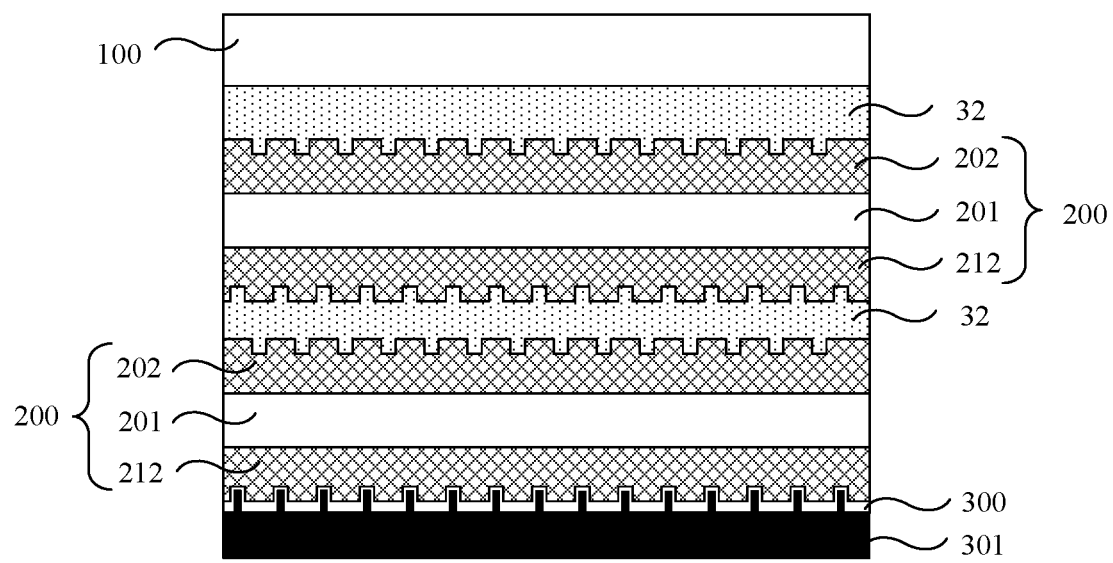
FIG. 8 is a schematic structural diagram 2 of a housing according to some embodiments of this application.

Based on this, as shown in FIG. 8, a second bonding layer 32 is disposed between any two adjacent double-sided composite texture films 200. The second bonding layer 32 is in contact with a second texture layer 212 of a double-sided composite texture film 200 located above, and a part of the second bonding layer 32 is filled in a groove 15 in a second texture pattern A2 of the second texture layer 212. In addition, the second bonding layer 32 is in contact with a first texture layer 202 of a double-sided composite texture film 200 located below, and a part of the second bonding layer 32 is filled in a groove 15 in a first texture pattern A1 at the first texture layer 202. In this case, to enable human eyes to identify the first texture pattern A1 and the second texture pattern A2, it can be learned from the foregoing that a refractive index of the second bonding layer 32 is different from a refractive index of a film layer (for example, the first texture layer 202 or the second texture layer 212) in contact with the second bonding layer 32.

A method for fabricating the housing 01 shown in FIG. 8 is as follows: performing S101 to S106 to obtain a double-sided composite texture film 200, an optical coating 300, and an ink layer 301 that are disposed in a stacked manner;

repeating S101 to S103 to make the other double-sided composite texture film 200;

bonding, through the second bonding layer 32, the other double-sided composite texture film 200 to a film formed after S101 to S106 are performed; and processing a structure obtained after bonding with reference to S107 and S108, to complete the housing 01 having a plurality of texture layers.

Example 3

Figure 9:
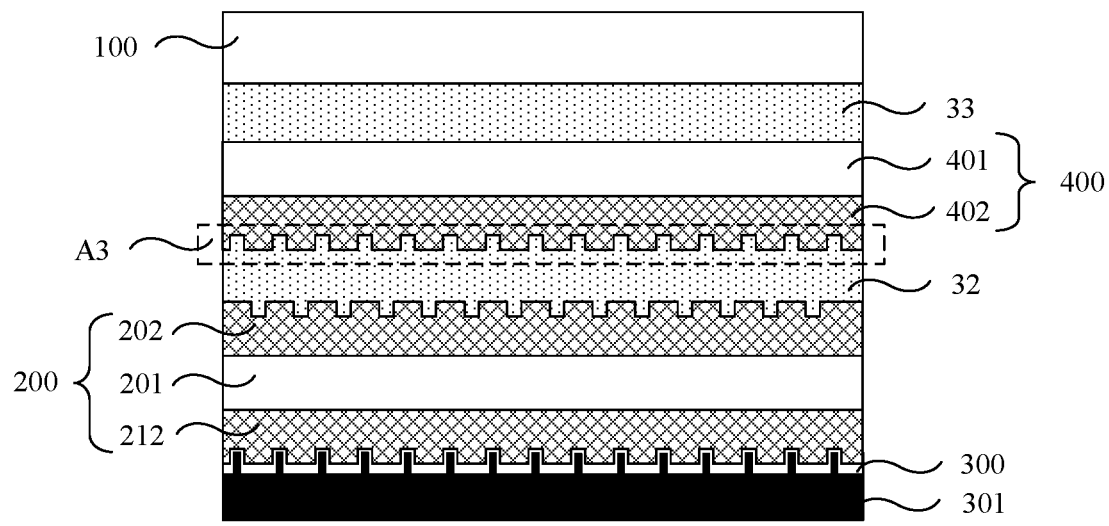
FIG. 9 is a schematic structural diagram 3 of a housing according to some embodiments of this application.

Based on a case in which the housing 01 has at least one double-sided composite texture film 200, as shown in FIG. 9, the housing 01 further includes at least one single-sided composite texture film 400, and the single-sided composite texture film 400 is located on one side of an inner surface of the housing substrate 100. For example, in FIG. 9, the single-sided composite texture film 400 is disposed between the double-sided composite texture film 200 and the housing substrate 100.

The single-sided composite texture film 400 includes a second substrate 401 and a third texture layer 402 located on a surface that is of the second substrate 401 and that is away from the housing substrate 100. The third texture layer 402 has a third texture pattern A3 that includes a plurality of grooves and a plurality of bosses.

Alternatively, the third texture layer 402 may be disposed on a surface that is of the second substrate 401 and that is close to the housing substrate 100. This is not limited in this application. For ease of description, description is provided below by using an example in which the third texture layer 402 is located on the surface that is of the second substrate 401 and that is away from the housing substrate 100.

A method for fabricating the housing 01 shown in FIG. 9 includes:

performing S101 to S106, to obtain a double-sided composite texture film 200, an optical coating 300, and an ink layer 301 that are disposed in a stacked manner;

using PET, TPU, or the like to make the second substrate 401;

tiling UV adhesive 20 on a surface of the second substrate 401, rolling the UV adhesive through a mold having a texture, and exposing the UV adhesive to form a third texture layer 402 having a third texture pattern A3 shown in FIG. 9, to complete preparation of the single-sided composite texture film 400;

coating, with an optically clear adhesive, a surface that is of the second substrate 401 of the single-sided composite texture film 400 and that is away from the third texture layer 402, to form a third bonding layer 33, and bonding a release film to a surface that is of the third bonding layer 33 and that is away from the second substrate 401, where it should be noted that, in this embodiment of this application, a bonding layer that is in direct contact with a film layer that has a flat surface and on which no texture pattern is disposed, for example, a surface that is of the second substrate 401 and that is away from the third texture layer 402 is referred to as the third bonding layer 33;

bonding, through the second bonding layer 32 formed in S104, the single-sided composite texture film 400 to a film formed after S101 to S106 are performed;

cleaning a film layer formed in the foregoing steps, and then cutting the cleaned film layer according to a designed size through laser cutting or by using a CNC cutting knife; and removing a release film on the third bonding layer 33, and bonding the film layer formed in the foregoing steps to an inner surface of the housing substrate 100, to complete the housing 01 having a plurality of texture layers shown in FIG. 9.

Example 4

Figure 10:
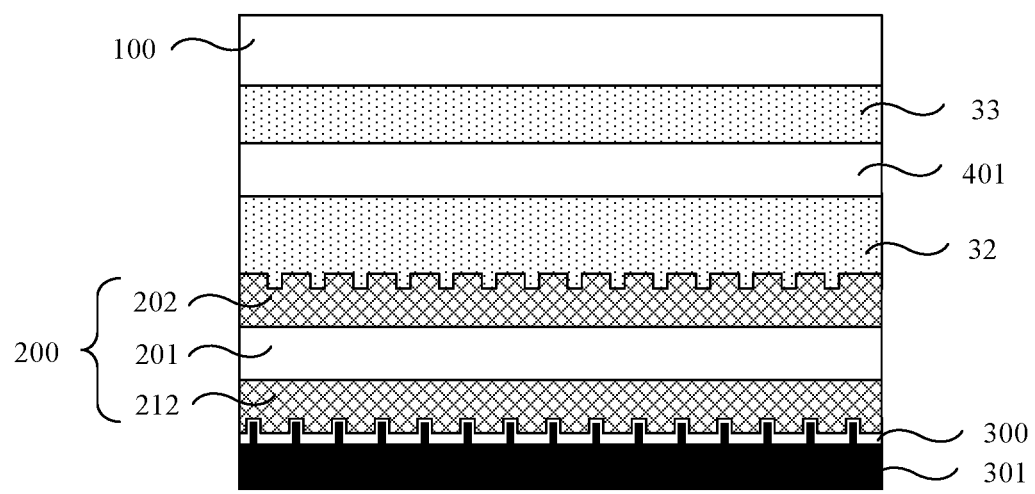
FIG. 10 is a schematic structural diagram 4 of a housing according to some embodiments of this application.

Based on a case in which the housing 01 has at least one double-sided composite texture film 200, as shown in FIG. 10, the housing 01 further includes a second substrate 401, and the second substrate 401 is located between a housing substrate 100 and the double-sided composite texture film 200.

A method for fabricating the housing 01 shown in FIG. 10 is as follows: first performing S101 to S106, to obtain a double-sided composite texture film 200, an optical coating 300, and an ink layer 301 that are disposed in a stacked manner;

using PET, TPU, or the like to make the second substrate 401, and coating a surface of the second substrate 401 with an optically clear adhesive to form the third bonding layer 33;

bonding the release film to a surface that is of the third bonding layer 33 and that is away from the second substrate 401;

bonding, through the second bonding layer 32 formed in S104, a surface that is of the second substrate 401 and on which the third bonding layer 33 is not formed to the film formed after S101 to S106 are performed;

cleaning a film layer formed in the foregoing steps, and then cutting the cleaned film layer according to a design through laser cutting or by using a CNC cutting knife; and removing a release film on the third bonding layer 33, and bonding the film layer formed in the foregoing steps to an inner surface of the housing substrate 100, to complete the housing 01 having a plurality of texture layers shown in FIG. 10.

In comparison with the solution shown in FIG. 2, in the solution shown in FIG. 10, the second substrate 401 is added, so that rigidity of the housing 01 and reliability of the housing 01 can be improved by adding the second substrate 401, to avoid a case in which the optical coating 300 or a texture layer such as the first texture layer 202 or the second texture layer 212 of the housing 01 is cracked in a test and use process of the mobile terminal having the housing 01.

It should be noted that in the foregoing example, the housing substrate 100 may be a glass substrate (for example, 2D glass or 3D glass), a polymethyl methacrylate (PMMA) substrate, a composite plate that includes a PC film substrate and a PMMA film substrate that are disposed in a stacked manner, a resin substrate having same or similar hardness as the glass substrate, or a transparent or translucent inorganic object, for example, a substrate formed by ceramics, sapphire, or the like. This is not limited in this disclosure.

In addition, that the inner surface and the outer surface of the housing substrate 100 are flat is used for description in the foregoing examples. To increase a quantity of texture layers of the housing 01, to increase complexity of a new texture pattern generated after a plurality of texture layers are superimposed. This application provides the following examples.

Example 5

Figure 11:
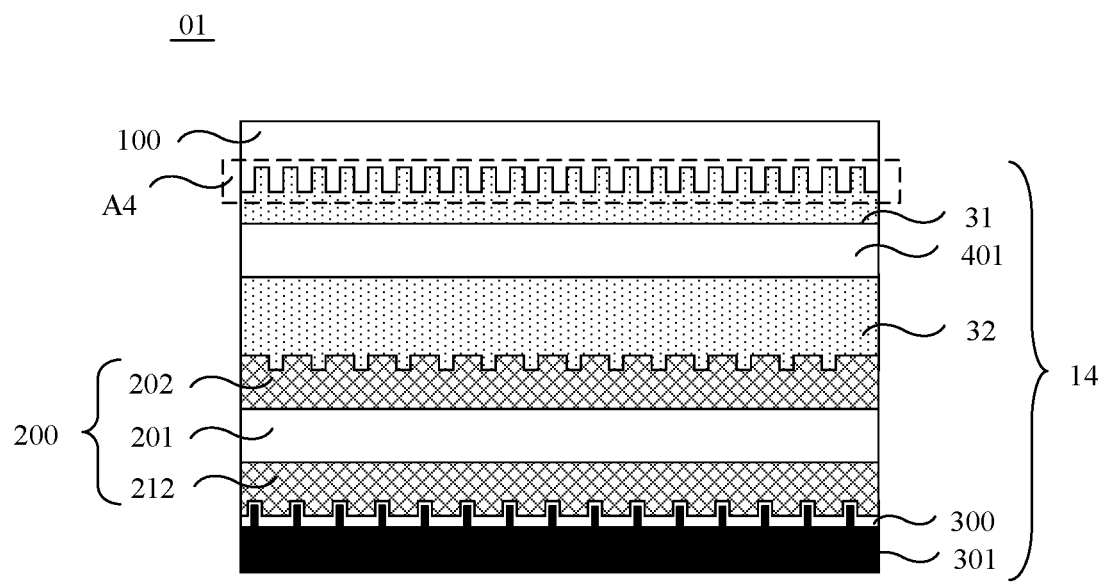
FIG. 11 is a schematic structural diagram 5 of a housing according to some embodiments of this application.

Based on case in which the housing 01 has at least one double-sided composite texture film 200. As shown in FIG. 11, an inner surface of the housing substrate 100 has a fourth texture pattern A4, and the fourth texture pattern A4 includes a plurality of grooves and a plurality of bosses.

In this case, in the method for fabricating the housing 01 shown in FIG. 10, a method for fabricating a multi-layer film layer other than the housing substrate 100 is the same as that described above. Details are not described herein again. For ease of description, the multi-layer film layer of the housing 01 other than the housing substrate 100 is referred to as a multi-layer texture composite film 14.

An example in which the housing substrate 100 is a glass substrate is used to describe a fabrication method of the housing substrate 100. The method includes S201 to S202.

S201: Etch an inner surface of a glass substrate to form the fourth texture pattern A4.

For example, the inner surface of the glass substrate is coated with a photoresist material such as acid-resistant ink, photoresist, or metal coating. For example, the photoresist material is a positive photoresist. After exposure and development, a photoresist blocked by a light shielding part of a mask panel is still retained, and a photoresist that is on the inner surface of the glass substrate and that corresponds to a light transmission part of the mask panel is removed. When the photoresist material is a negative photoresist, a position that is on the photoresist and that is illuminated by light is not dissolved in developing liquid, and a position that is not illuminated by light is dissolved in the developing liquid. Next, some materials in an area that is of the glass substrate and that is not covered by the photoresist are etched away by using a dry etching process or a wet etching process. Then, the photoresist is removed, so that the fourth texture pattern A4 is prepared on the inner surface of the glass substrate.

It should be noted that in S201, description is provided by using an example in which a photoresist is coated, and a film layer having a pattern is formed on a to-be-etched surface of the glass substrate after exposure and development. In this application, the film layer having a pattern may be further formed on the to-be-etched surface of the glass substrate by using a printing process, or the film layer (for example, an acid-resistant film layer) having a pattern is directly bonded to the to-be-etched surface of the glass substrate by using a film bonding process. This is not limited in this application. Then, the foregoing etching process is performed to form the fourth texture pattern A4.

S202: Perform chemical strengthening on the glass substrate prepared in S201, to improve rigidity of the housing substrate 100. Based on this, in order that the housing substrate 100 having the fourth texture pattern A4 on the inner surface is bonded to the foregoing multi-layer texture composite film 14, as shown in FIG. 11, the housing 01 further includes a first bonding layer 31 located on the inner surface of the housing substrate 01. Therefore, the housing substrate 100 is bonded to the multi-layer texture composite film 14 through the first bonding layer 31.

It should be noted that in this embodiment of this application, a bonding layer that is in direct contact with an inner surface that is of the housing substrate 100 and that has the fourth texture pattern A4 is referred to as the first bonding layer 31.

In addition, some materials of the first bonding layer 31 are filled in a groove on the inner surface of the housing substrate 100. Therefore, to enable human eyes to identify the fourth texture pattern A4 on the inner surface of the housing substrate 100, a refractive index of the first bonding layer 31 is different from a refractive index of the housing substrate 100, for example, the glass substrate.

Figure 12:
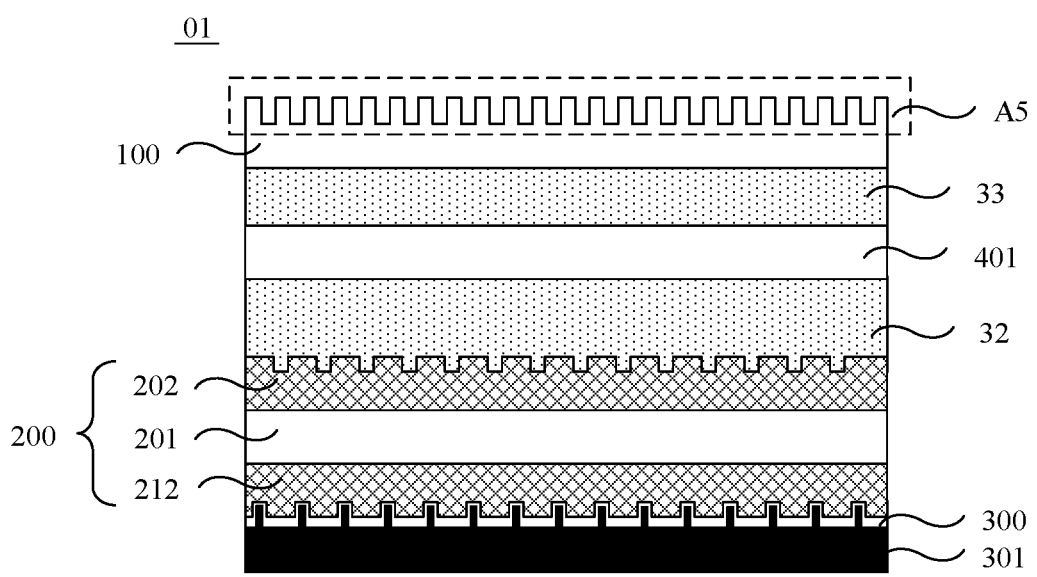
FIG. 12 is a schematic structural diagram 6 of a housing according to some embodiments of this application.

Alternatively, as shown in FIG. 12, an outer surface of the housing substrate 100 has a fifth texture pattern A5. The fifth texture pattern A5 includes a plurality of grooves and a plurality of bosses.

A method for fabricating the housing substrate 100 having the fifth texture pattern A5 is the same as that described above. Details are not described herein again. A difference lies in that when no texture pattern is disposed on the inner surface of the housing substrate 100, the inner surface of the housing substrate 100 may be bonded to the multi-layer texture composite film 14 through the third bonding layer 33. A refractive index of the third bonding layer 33 is not limited in this application.

Figure 13:
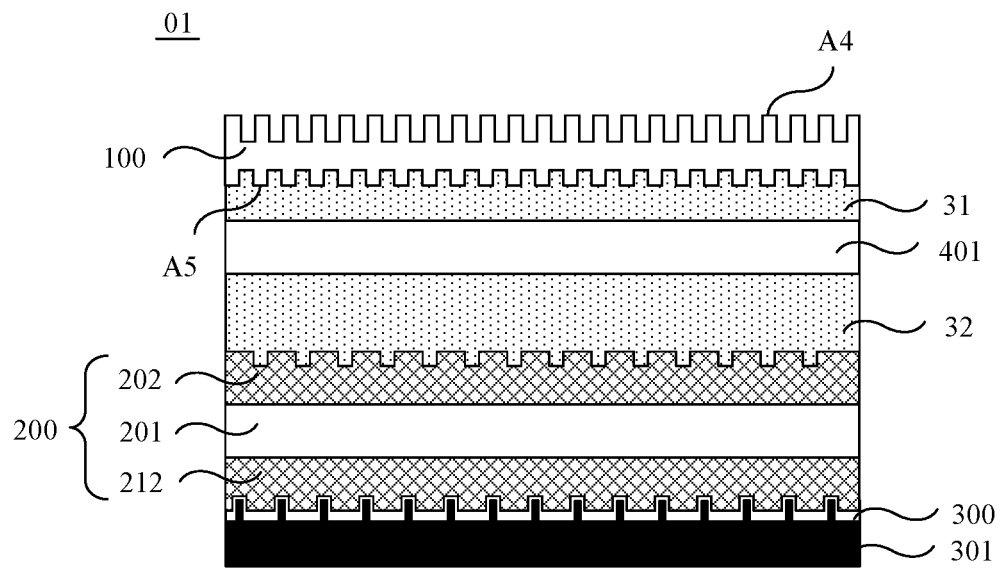
FIG. 13 is a schematic structural diagram 7 of a housing according to some embodiments of this application.

Alternatively, as shown in FIG. 13, the inner surface of the housing substrate 100 has the fourth texture pattern A4, and the outer surface of the housing substrate 100 has the fifth texture pattern A5. The method for fabricating the housing substrate 100 and the multi-layer texture composite film 14 shown in FIG. 13 is the same as that described above. Details are not described herein again. It should be noted that because the inner surface of the housing substrate 100 in FIG. 13 has the fourth texture pattern A4, the housing substrate 100 and the multi-layer texture composite film 14 may be bonded and fastened through the first bonding layer 31 whose refractive index is different from that of the housing substrate 100.

It should be noted that in Example 5, description is provided by using an example in which the housing substrate 100 is a glass substrate. The housing substrate 100 may alternatively be a resin substrate having same or similar hardness as the glass substrate, or may be a transparent or translucent inorganic material, for example, a substrate made of ceramic and sapphire. In this case, the fourth texture pattern A4 and/or the fifth texture pattern A5 may also be formed by using a process such as an exposure process or an etching process or a printing process or a film bonding process. Details are not described herein again in this application.

In addition, in FIG. 9 to FIG. 13, description is provided by using an example in which the housing 01 has one double-sided composite texture film 200. The housing 01 may further include a plurality of double-sided composite texture films 200 that are disposed in a stacked manner and a plurality of single-sided composite texture films 400 that are disposed in a stacked manner. A double-sided composite texture film 200 and a single-sided composite texture film 400 may also be disposed in a cross manner. This is not limited in this application. When it is ensured that a thickness of the housing 01 meets a design requirement, a quantity of the double-sided composite texture films 200 and/or a quantity of single-sided composite texture films 400 may be increased as much as possible, so that a more complex pattern is obtained after the foregoing plurality of texture patterns such as the first texture pattern A1, the second texture pattern A2, the third texture pattern A3, the fourth texture pattern A4, and the fifth texture pattern A5 are superimposed.

In addition, to improve non-replicability of a pattern formed after texture patterns at a plurality of different layers are superimposed, the first texture pattern A1, the second texture pattern A2, the third texture pattern A3, the fourth texture pattern A4, and the fifth texture pattern A5 may be different from each other.

The housing 01 provided in the foregoing example may be used as the back cover 12 of the mobile phone, or may be used as the front cover 10 of the mobile phone. This is not limited in this disclosure. When the housing 01 in Example 2 to Example 5 is the front cover 10, refer to the method for fabricating the front cover 10 provided in Example 1. Details are not described herein again in this application.

Example 6

Based on a case in which the housing 01 has at least one double-sided composite texture film 200, another embodiment of this application provides a housing 01 prepared by using an in-mold injection molding film (IMTL) technology.

Figure 14:
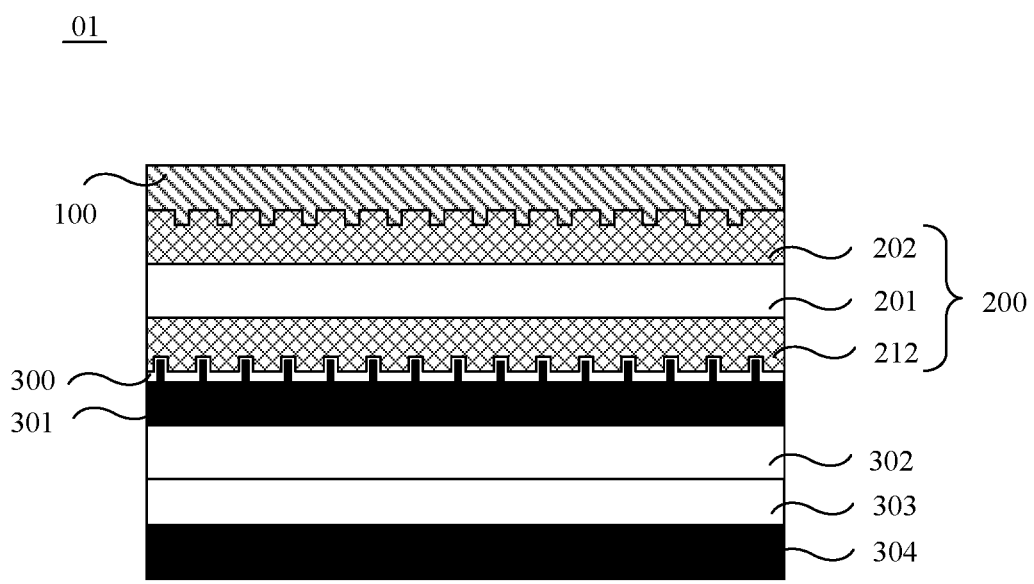
FIG. 14 is a schematic structural diagram 8 of a housing according to some embodiments of this application.

In this case, the housing substrate 100 of the housing 01 is a hardened layer. Based on this, as shown in FIG. 14, the housing 01 further includes a glossy oil buffer layer 302, an adhesive layer 303, and an injection molding layer 304 that are sequentially away from the housing substrate 100. The glossy oil buffer layer 302 is in contact with the ink layer 301.

A method for fabricating the housing 01 shown in FIG. 14 includes the following operations:
  performing S101 to S103, to obtain the double-sided composite texture film 200;
  on the foregoing double-sided composite texture film 200, sequentially forming the optical coating 300 and the ink layer 301 on a surface that is of the second texture layer 212 and that has the second texture pattern A2;
  on a film obtained after the foregoing steps are completed, sequentially forming, by using a printing process, a glossy oil buffer layer 302 and an adhesive layer 303 that are located on a surface that is of the ink layer 301 and that is away from the double-sided composite texture film 200;
  performing, by using the IMTL process, injection molding on the film obtained after the foregoing steps are completed, to form the injection molding layer 304 on one side that is of the adhesive layer 303 and that is away from the glossy oil buffer layer 302, where the glossy oil buffer layer 302 can buffer force applied to the optical coating 300 and the ink layer 301 in an injection molding process, to avoid damage to the optical coating 300 and the ink layer 301; and
  in addition, in the injection molding process, an appearance of the injection molding layer 304 may be determined according to a requirement for an appearance of the housing 01. For example, an appearance having a specific bending radian is formed at an edge position of the housing 01; and
  finally removing the protective layer 22 at the first texture layer 202 of the double-sided composite texture film 200 in S103, and forming, by using a spraying process or a sprinkling process, a hardened layer on a texture layer located at an outermost layer, for example, one side that is of the first texture layer 202 and that is away from the injection molding layer 304, where the hardened layer may be used as the housing substrate 100 of the housing 01. In this case, in the housing, the first texture layer 202 closest to the hardened layer is in direct contact with the hardened layer.

A material that forms the hardened layer may be siloxane, acrylic acid resin, siloxane-containing resin, nano-silicon dioxide, acrylic acid amino resin, or the like.

It should be noted that the housing 01 prepared by using the IMTL process is described by using an example in which the housing 01 has one double-sided composite texture film 200. The housing 01 may further have a plurality of double-sided composite texture films 200 and a plurality of single-sided composite texture films 400. Details are not described in this application.

Example 7

Based on a case in which the housing 01 has at least one double-sided composite texture film 200, another embodiment of this application provides a housing 01 prepared by using a composite plate technology.

In this case, the structure of the housing 01 is shown in FIG. 2, and the housing substrate 100 of the housing 01 is a hardened layer. In addition, the first substrate 201 of the at least one double-sided composite texture film 200 of the housing 01 is a composite plate that includes at least a polycarbonate (Polycarbonate, PC) film substrate and a PMMA film substrate that are disposed in a stacked manner.

Figure 15:
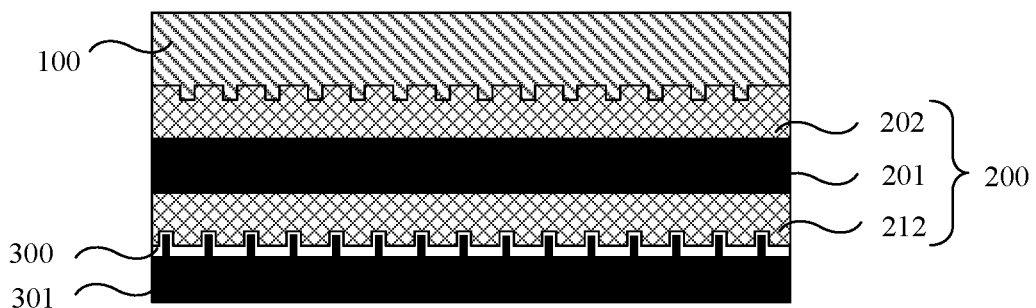
FIG. 15 is a schematic structural diagram 9 of a housing according to some embodiments of this application.

A method for fabricating the housing 01 that is provided in Example 7 and that is shown in FIG. 15 includes the following operations:
  preliminarily cutting the composite plate including at least a PC film substrate and a PMMA film substrate that are disposed in a stacked manner, to prepare the first substrate 201;
  performing S102 and S103, to obtain the double-sided composite texture film 200;
  on the foregoing double-sided composite texture film 200, sequentially forming the optical coating 300 and the ink layer 301 on a surface that is of the second texture layer 212 and that has the second texture pattern A2;
  performing, according to a design requirement of an appearance of the housing 01 by using a hot bending process, hot bending on an edge of a film formed after the foregoing steps are completed; and
  finally removing the protective layer 22 at the first texture layer 202 of the double-sided composite texture film 200 in S103, and forming, by using a spraying process or a sprinkling process, a hardened layer on a texture layer located at an outermost layer, for example, one side that is of the first texture layer 202 and that is away from the ink layer 301, where the hardened layer may be used as the housing substrate 100 of the housing 01. In this case, in the housing, the first texture layer 202 closest to the hardened layer is in direct contact with the hardened layer.

It should be noted that the housing 01 prepared by using the composite plate process is described by using an example in which the housing 01 has one double-sided composite texture film 200. The housing 01 may further have a plurality of double-sided composite texture films 200 and a plurality of single-sided composite texture films 400. Details are not described in this application. In this case, it only needs to be ensured that a first substrate 201 of one of the plurality of double-sided composite texture films 200 is a composite plate including at least a PC film substrate and a PMMA film substrate that are disposed in a stacked manner. A material of a first substrate 201 of the remaining double-sided composite texture film 200 and a material of a second substrate 401 of the single-sided composite texture film 400 are not limited in this application.

Figure 16:
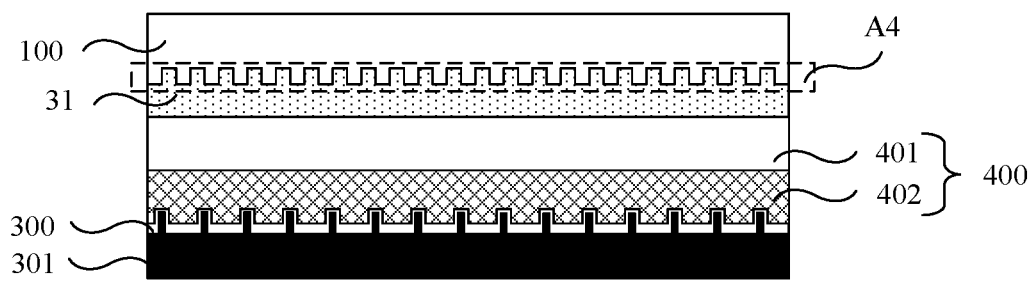
FIG. 16 is a schematic structural diagram 10 of a housing according to some embodiments of this application.
Figure 17:
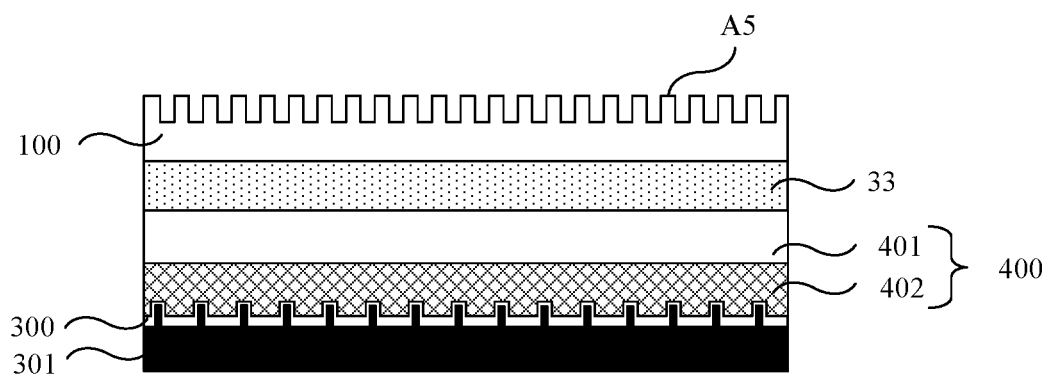
FIG. 17 is a schematic structural diagram 11 of a housing according to some embodiments of this application.
Figure 18:
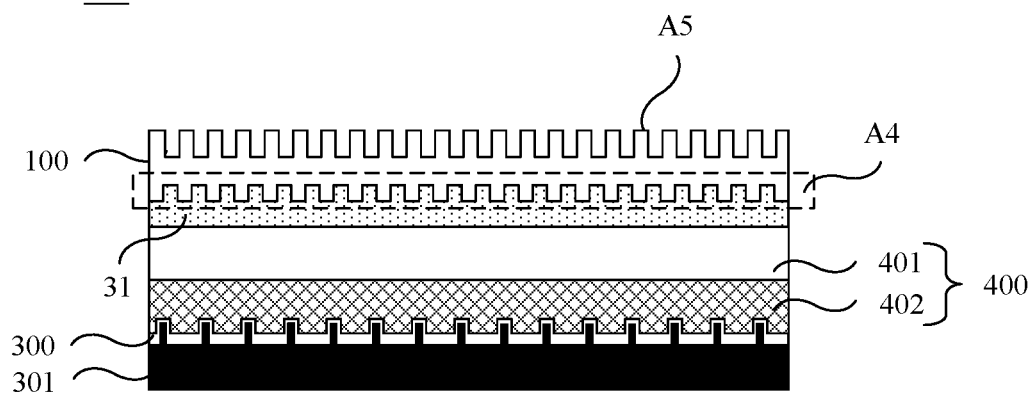
FIG. 18 is a schematic structural diagram 12 of a housing according to some embodiments of this application.

A housing 01 provided in some other embodiments of this application is shown in FIG. 16, FIG. 17, and FIG. 18. The housing 01 includes a housing substrate 100 having a texture pattern and at least one single-sided composite texture film 400 located on one side of an inner surface of the housing substrate 100. Based on this, this application provides the following structure of the housing 01.

Example 8

When the housing 01 includes a housing substrate 100 having a texture pattern and at least one single-sided composite texture film 400, as shown in FIG. 16, an inner surface of the housing substrate 100 has a fourth texture pattern A4, and the fourth texture pattern A4 includes a plurality of grooves and a plurality of bosses.

A method for fabricating the fourth texture pattern A4 on the inner surface of the housing substrate 100 and a method for fabricating the single-sided composite texture film 400 are the same as those described above. Details are not described herein again.

Similarly, in order that the housing substrate 100 having the fourth texture pattern A4 on the inner surface is bonded to the single-sided composite texture film 400, a first bonding layer 31 is disposed on the inner surface of the housing substrate 100, and a refractive index of the first bonding layer 31 is different from a refractive index of the housing substrate 100.

Example 9

When the housing 01 includes a housing substrate 100 having a texture pattern and at least one single-sided composite texture film 400, as shown in FIG. 17, an outer surface of the housing substrate 100 has a fifth texture pattern A5, and the fifth texture pattern A5 includes a plurality of grooves and a plurality of bosses.

A method for fabricating the fifth texture pattern A5 on the outer surface of the housing substrate 100 and a method for fabricating the single-sided composite texture film 400 are the same as those described above. Details are not described herein again.

Example 10

When the housing 01 includes a housing substrate 100 having a texture pattern and at least one single-sided composite texture film 400, as shown in FIG. 18, an inner surface of the housing substrate 100 has a fourth texture pattern A4, and an outer surface of the housing substrate 100 has a fifth texture pattern A5.

In addition, for any structure in Example 8 to Example 10, the housing 01 further includes an optical coating 300 and an ink layer 301 that are sequentially away from the housing substrate 100. The optical coating 300 is in contact with a single-sided composite texture film 400 that is farthest away from the housing substrate 100.

It may be learned from the foregoing that in the housing 01 provided in Example 8 to Example 10, a new relatively complex texture pattern, for example, an interference texture pattern, is formed by superimposing texture patterns on the inner surface and/or the outer surface of the housing substrate 100 and a texture pattern at the third texture layer 402 of the at least one single-sided composite texture film 400, to increase diversity and complexity of a decorative effect of the housing 01, and to increase decoration duplication difficulty of the housing 01.

In addition, the housing substrate 100 may be a glass substrate, a resin substrate having same or similar hardness as the glass substrate, or a transparent or translucent inorganic material, for example, a substrate made of ceramic and sapphire.

Example 11

Figure 21:
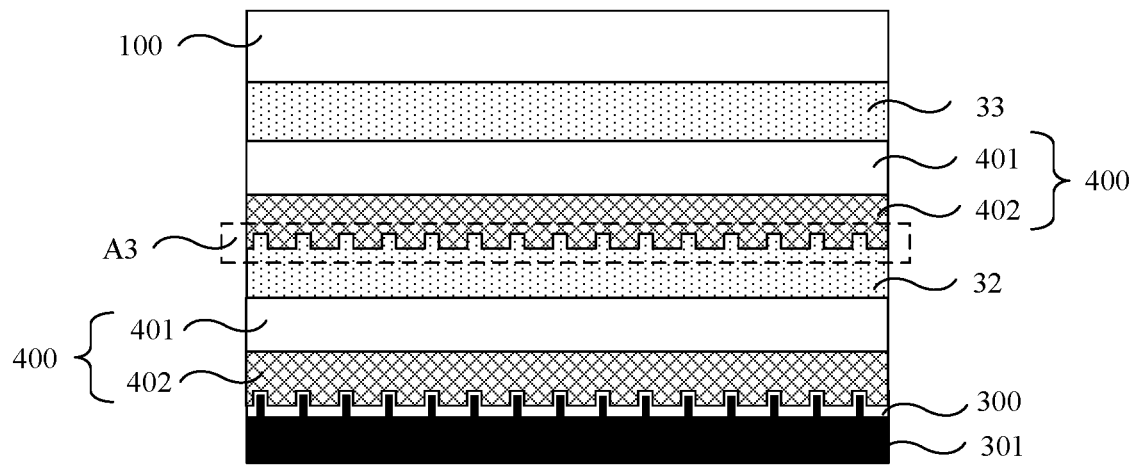
FIG. 21 is a schematic structural diagram 15 of a housing according to some embodiments of this application.

In this example, as shown in FIG. 21, the housing 01 further includes at least two single-sided composite texture films 400 that are located on one side of an inner surface of the housing substrate 100.

The single-sided composite texture film 400 includes a second substrate 401 and a third texture layer 402 located on a surface that is of the second substrate 401 and that is away from or close to the housing substrate 100. The third texture layer 402 has a third texture pattern A3 that includes a plurality of grooves and a plurality of bosses.

It should be noted that for ease of description, description is provided below by using an example in which the third texture layer 402 is located on a surface that is of the second substrate 401 and that is away from the housing substrate 100. A method for fabricating the single-sided composite texture film 400 is the same as the method for fabricating the single-sided composite texture film 400 in Embodiment 3. Details are not described herein again.

Based on this, as shown in FIG. 21, the housing 01 further includes a second bonding layer 32 located between two adjacent single-sided composite texture films 400.

When the second bonding layer 32 is in contact with the third texture layer 402, some materials of the second bonding layer 32 can be filled in each groove 15 in a third texture pattern A3 of the third texture layer 402. As described above, in order that the user can identify the third texture pattern A3 at the third texture layer 402, a refractive index of the second bonding layer 32 is set to be different from a refractive index of the third texture layer 402 in contact with the second bonding layer 32.

Based on this, as shown in FIG. 21, the housing 01 further includes an optical coating 300 and an ink layer 301 that are sequentially away from the housing substrate 100. A surface on one side of the optical coating 300 is in contact with a surface that is of the single-sided composite texture film 400 and that is away from the housing substrate 100, and a surface on the other side of the optical coating 300 is in contact with the ink layer 301.

In addition, in this example, the inner surface and the outer surface of the housing substrate 100 may be flat surfaces shown in FIG. 21. Alternatively, as shown in FIG. 16, the inner surface of the housing substrate 100 has a fourth texture pattern A4. Alternatively, as shown in FIG. 17, the outer surface of the housing substrate 100 has a fifth texture pattern A5. Alternatively, as shown in FIG. 18, the inner surface of the housing substrate 100 has a fourth texture pattern A4, and the outer surface of the housing substrate 100 has a fifth texture pattern A5.

Example 12

Figure 22:
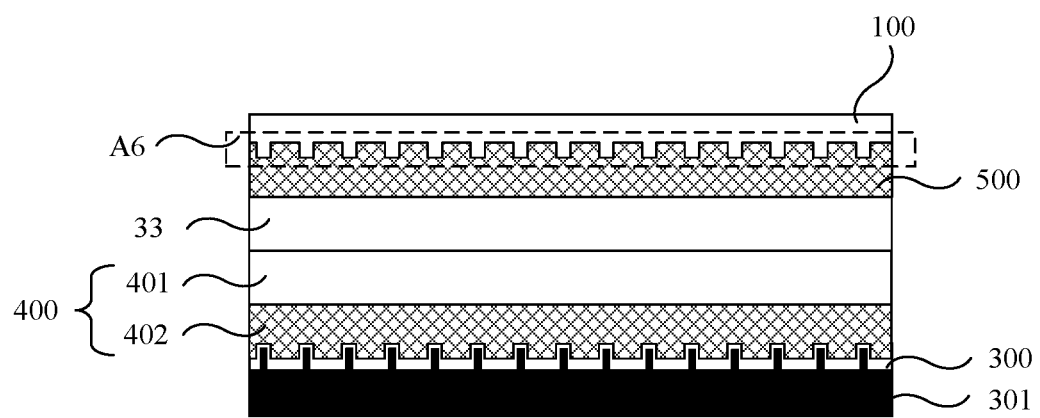
FIG. 22 is a schematic structural diagram 16 of a housing according to some embodiments of this application.

In this example, as shown in FIG. 22, the housing 01 further includes at least one single-sided composite texture film 400 that is located on one side of an inner surface of the housing substrate 100.

The housing 01 further includes an injection-molding texture layer 500. The injection-molding texture layer 500 and the single-sided composite texture film 401 are disposed in a stacked manner. In FIG. 22, a surface that is of the injection-molding texture layer 500 and that is away from the housing substrate 100 is bonded to the second substrate 401 of the single-sided composite texture film 400 through the third bonding layer 33.

In addition, the housing substrate 100 is a hardened layer. A surface that is of the injection-molding texture layer 500 and that is close to the hardened layer (namely, the housing substrate 100) is in contact with the hardened layer. A surface that is of the injection-molding texture layer 500 and that is in contact with the hardened layer has a sixth texture pattern A6, and the sixth texture pattern A6 includes a plurality of grooves and a plurality of bosses.

In this case, a material that forms the injection-molding texture layer 500 may be a plastic material that can be formed by using an injection-molding process, for example, PMMA. In this case, a mold having a pattern that matches the sixth texture pattern A6 may be used to form the injection-molding texture layer 500 by using the injection molding process.

It should be noted that in this embodiment of this application, a bonding layer that is in direct contact with a film layer that has a flat surface and on which no texture pattern is disposed, for example, a surface that is of the injection-molding texture layer 500 and that is away from the hardened layer, and a surface that is of the second substrate 401 and that is close to the hardened layer is referred to as the third bonding layer 33.

Based on this, as shown in FIG. 22, the housing 01 further includes an optical coating 300 and an ink layer 301 that are sequentially away from the housing substrate 100.

Figure 19A:
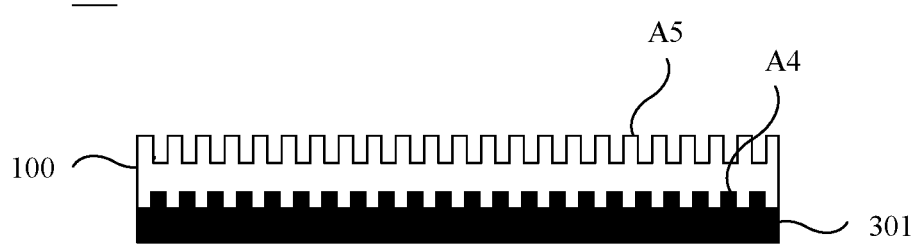
FIG. 19a is a schematic structural diagram 13 of a housing according to some embodiments of this application.

A housing 01 provided in some other embodiments of this application is shown in FIG. 19a or FIG. 19. The housing 01 includes a housing substrate 100. The housing substrate may be a glass substrate, a resin substrate having same or similar hardness as the glass substrate, or a transparent or translucent inorganic material, for example, a substrate made of ceramic and sapphire.

In addition, an inner surface of the housing substrate 100 has a fourth texture pattern, and the fourth texture pattern A4 includes a plurality of grooves and a plurality of bosses.

An outer surface of the housing substrate 100 has a fifth texture pattern A5, and the fifth texture pattern A5 includes a plurality of grooves and a plurality of bosses.

A method for respectively fabricating the fourth texture pattern A4 and the fifth texture pattern A5 on the inner surface and the outer surface of the housing substrate 100 is the same as that described above. Details are not described herein again.

In addition, the housing 01 further includes an ink layer 301 located on one side of the inner surface of the housing substrate. For example, as shown in FIG. 19a, the ink layer 301 may be directly formed on the inner surface of the housing substrate 100 by using a printing process. Alternatively, as shown in FIG. 19b, the optical coating 300 may be directly formed on the inner surface of the housing substrate 100 by using a vacuum evaporation deposition process, and then the ink layer 301 is formed, by using a printing process, on a surface that is of the optical coating 300 and that is away from the housing substrate 100.

Figure 19B:
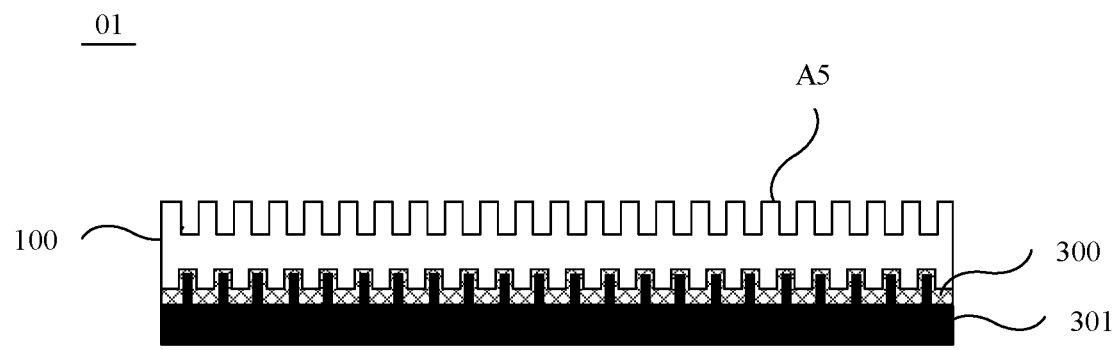
FIG. 19b is a schematic structural diagram 14 of a housing according to some embodiments of this application.

It may be learned from the foregoing that in the housing 01 shown in FIG. 19a or FIG. 19b, a new relatively complex texture pattern is formed by superimposing texture patterns of the inner surface and the outer surface of the housing substrate 100, to increase diversity and complexity of a decorative effect of the housing 01. In addition, the housing 01 provided in FIG. 19a or FIG. 19b has a simpler structure and a thinner thickness.

Figure 20:
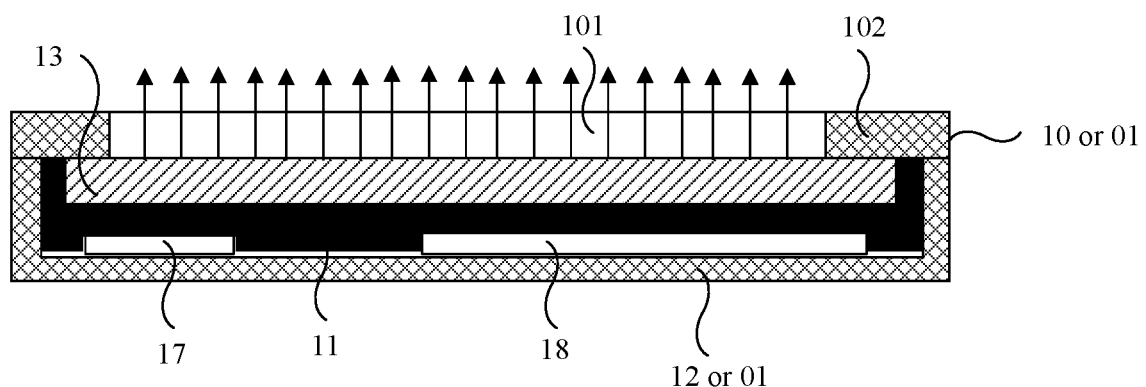
FIG. 20 is a schematic structural diagram of a mobile terminal according to some embodiments of this application.

Some embodiments of this application provide a mobile terminal. As shown in FIG. 1, the mobile terminal includes a display 13 and a middle frame 11. As shown in FIG. 20, the display 13 is installed in the middle frame 11. In addition, the mobile terminal further includes any one of the foregoing housings 01. The mobile terminal has a technical effect the same as that of the housing provided in the foregoing embodiments. Details are not described herein again.

As shown in FIG. 20, the housing 01 is a front cover 10, and the front cover 10 is disposed on an out-light surface of the display 13. The front cover 10 has a light transmission area 101 and a light shielding area 102 located around the light transmission area 101. The light transmission area 101 of the front cover 10 can transmit display light emitted by the display 13, and the light shielding area 102 of the front cover 10 can shield an area that is of the display 13 and in which a drive circuit is disposed.

Alternatively, as shown in FIG. 20, the housing 01 is a back cover 12, and the back cover 12 is disposed on one side that is of the middle frame 11 and that is away from the out-light surface of the display 13, to protect internal components such as a mainboard 17 and a battery 18 that are installed on the middle frame 11.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:
1. A housing, comprising:
a housing substrate; and
a double-sided composite texture film located on a first side of an inner surface of the housing substrate, wherein the double-sided composite texture film comprises
a first substrate,
a first texture layer disposed on a first surface of the first substrate, and
a second texture layer disposed on a second surface of the first substrate, wherein
the first surface of the first substrate is close to the housing substrate and the second surface is away from the housing substrate,
each of the first texture layer and the second texture layer comprises a plurality of grooves and a plurality of bosses;
wherein the housing substrate is a hardened layer;
a material that forms the first substrate comprises polyethylene terephthalate or a thermoplastic polyurethane elastomer;
the housing further comprises an ink layer, a glossy oil buffer layer, an adhesive layer, and an injection molding layer that are sequentially away from the housing substrate, and the double-sided composite texture film is located between the ink layer and the housing substrate; and
the first texture layer closest to the hardened layer is in direct contact with the hardened layer within the housing.

2. The housing according to claim 1, wherein the housing further comprises a single-sided composite texture film disposed on the first side of the inner surface of the housing substrate and disposed with the double-sided composite texture film in a stacked manner,
  wherein the single-sided composite texture film comprises a second substrate and a third texture layer disposed on a surface of the second substrate, and
  wherein the third texture layer comprises a plurality of grooves and a plurality of bosses.

3. The housing according to claim 1, wherein the inner surface of the housing substrate comprises a plurality of grooves and a plurality of bosses; and
  wherein the housing further comprises a first bonding layer disposed on the inner surface of the housing substrate, and a refractive index of the first bonding layer is different from a refractive index of the housing substrate.

4. The housing according to claim 2, wherein the inner surface of the housing substrate comprises a plurality of grooves and a plurality of bosses; and
  wherein the housing further comprises a first bonding layer disposed on the inner surface of the housing substrate, and a refractive index of the first bonding layer is different from a refractive index of the housing substrate.

5. The housing according to claim 1, wherein an outer surface of the housing substrate comprises a plurality of grooves and a plurality of bosses.

6. The housing according to claim 3, wherein an outer surface of the housing substrate comprises a plurality of grooves and a plurality of bosses.

7. The housing according to claim 1, wherein the housing further comprises a second substrate disposed between the housing substrate and the double-sided composite texture film.

8. The housing according to claim 1, wherein the housing substrate is a hardened layer;
  the first substrate is a composite plate that comprises at least a polycarbonate film substrate and a polymethacrylate substrate that are disposed in a stacked manner; and
  the first texture layer closest to the hardened layer is in direct contact with the hardened layer within the housing.

9. The housing according to claim 2, wherein the housing further comprises a second bonding layer in contact with the first texture layer, the second texture layer, or the third texture layer; and
  wherein a refractive index of the second bonding layer is different from a refractive index of a film layer in contact with the second bonding layer.

10. A mobile terminal, comprising:
  a middle frame;
  a display installed in the middle frame; and
  a housing forming a front cover disposed on an out-light surface of the display or forming a back cover disposed on one side of the middle frame and away from the out-light surface of the display,
  wherein the housing comprises a housing substrate and a double-sided composite texture film disposed on a first side of an inner surface of the housing substrate;
  the double-sided composite texture film comprises a first substrate, a first texture layer disposed on a first surface of the first substrate, and a second texture layer disposed on a second surface of the first substrate;
  the first surface of the first substrate is close to the housing substrate, and the second surface is away from the housing substrate;
  each of the first texture layer and the second texture layer comprises a plurality of grooves and a plurality of bosses;
  wherein the housing substrate is a hardened layer;
  a material that forms the first substrate comprises polyethylene terephthalate or a thermoplastic polyurethane elastomer;
  the housing further comprises an ink layer, a glossy oil buffer layer, an adhesive layer, and an injection molding layer that are sequentially away from the housing substrate, and the double-sided composite texture film is disposed between the ink layer and the housing substrate; and
  the first texture layer closest to the hardened layer is in direct contact with the hardened layer within the housing.

11. The mobile terminal according to claim 10, wherein the housing further comprises a one single-sided composite texture film disposed on the first side of the inner surface of the housing substrate and disposed with the double-sided composite texture film in a stacked manner;
  wherein the single-sided composite texture film comprises a second substrate and a third texture layer disposed on a surface of the second substrate; and
  wherein the third texture layer comprises a plurality of grooves and a plurality of bosses.

12. The mobile terminal according to claim 10, wherein the inner surface of the housing substrate comprises a plurality of grooves and a plurality of bosses; and
  the housing further comprises a first bonding layer disposed on the inner surface of the housing substrate, and a refractive index of the first bonding layer is different from a refractive index of the housing substrate.

13. The mobile terminal according to claim 11, wherein the inner surface of the housing substrate comprises a plurality of grooves and a plurality of bosses; and
  the housing further comprises a first bonding layer disposed on the inner surface of the housing substrate, and a refractive index of the first bonding layer is different from a refractive index of the housing substrate.

14. The mobile terminal according to claim 10, wherein an outer surface of the housing substrate comprises a plurality of grooves and a plurality of bosses.

15. The mobile terminal according to claim 12, wherein an outer surface of the housing substrate comprises a plurality of grooves and a plurality of bosses.

16. The mobile terminal according to claim 10, wherein the housing further comprises a second substrate disposed between the housing substrate and the double-sided composite texture film.

17. The mobile terminal according to claim 10, wherein the housing substrate is a hardened layer;
  the first substrate is a composite plate that comprises at least a polycarbonate film substrate and a polymethacrylate substrate that are disposed in a stacked manner; and
  the first texture layer closest to the hardened layer is in direct contact with the hardened layer within the housing.

18. The mobile terminal according to claim 11, wherein the housing further comprises a second bonding layer in contact with the first texture layer, the second texture layer, or the third texture layer; and a refractive index of the second bonding layer is different from a refractive index of a film layer in contact with the second bonding layer.

\* \* \* \* \*